United States Patent
Ni

(10) Patent No.: US 9,854,194 B2
(45) Date of Patent: Dec. 26, 2017

(54) CMOS ACTIVE PIXEL STRUCTURE

(71) Applicant: NEW IMAGING TECHNOLOGIES, Verrieres le Buisson (FR)

(72) Inventor: Yang Ni, Palaiseau (FR)

(73) Assignee: NEW IMAGING TECHNOLOGIES, Verrieres le Buisson (FR)

( * ) Notice: Subject to any disclaimer, the term of this patent is extended or adjusted under 35 U.S.C. 154(b) by 185 days.

(21) Appl. No.: 14/438,212

(22) PCT Filed: Oct. 25, 2013

(86) PCT No.: PCT/EP2013/072444
§ 371 (c)(1),
(2) Date: Apr. 23, 2015

(87) PCT Pub. No.: WO2014/064274
PCT Pub. Date: May 1, 2014

(65) Prior Publication Data
US 2015/0281621 A1    Oct. 1, 2015

(30) Foreign Application Priority Data
Oct. 26, 2012    (FR) ...................... 12 60260

(51) Int. Cl.
*H04N 5/374*    (2011.01)
*H01L 27/146*    (2006.01)
(Continued)

(52) U.S. Cl.
CPC ....... *H04N 5/3742* (2013.01); *H01L 27/1461* (2013.01); *H01L 27/14609* (2013.01);
(Continued)

(58) Field of Classification Search
CPC ........... H01L 27/14609; H01L 27/1461; H01L 27/14612; H01L 27/14636;
(Continued)

(56) References Cited

U.S. PATENT DOCUMENTS 5,903,021 A    5/1999    Lee et al.
6,051,447 A    4/2000    Lee et al.
(Continued)

FOREIGN PATENT DOCUMENTS

EP    1354360 B1    8/2008
EP    2186318 B1    11/2011
(Continued)

OTHER PUBLICATIONS

French Preliminary Search Report, dated Jul. 17, 2013, two pages.
(Continued)

*Primary Examiner* — Francis M Legasse, Jr.
(74) *Attorney, Agent, or Firm* — Blakely Sokoloff Taylor & Zafman LLP

(57)    ABSTRACT

The invention concerns a structure of a CMOS active pixel, comprising a semi-conductive substrate (1) of a first type, at least one first photodiode operating in photovoltaic mode comprising a photovoltaic conversion area (2) defined by a doped area of a second type forming a PN junction with the substrate, said first photodiode re-emitting photoelectric charge carriers collected by the PN junction during the exposure of said first photodiode to a light, at least one second photodiode operating in integration mode and reverse-biased, said second photodiode comprising a charge accumulation area (3) defined by a doped area of the second type forming a PN junction with the substrate, said charge accumulation area being exposed to the charge carriers from the photovoltaic conversion area (2) in order to accumulate such charge carriers.

17 Claims, 13 Drawing Sheets

(51) Int. Cl.
  *H04N 5/355* (2011.01)
  *H04N 5/359* (2011.01)
  *H04N 5/369* (2011.01)

(52) U.S. Cl.
  CPC .. *H01L 27/14612* (2013.01); *H01L 27/14636* (2013.01); *H01L 27/14641* (2013.01); *H01L 27/14643* (2013.01); *H04N 5/355* (2013.01); *H04N 5/3592* (2013.01); *H04N 5/3594* (2013.01); *H04N 5/3696* (2013.01)

(58) Field of Classification Search
  CPC ........ H01L 27/14641; H01L 27/14643; H04N 5/355; H04N 5/3592; H04N 5/3594; H04N 5/3696; H04N 5/3742
  See application file for complete search history.

(56) References Cited

U.S. PATENT DOCUMENTS

| | | | |
|---|---|---|---|
| 6,531,725 | B2 | 3/2003 | Lee et al. |
| 6,777,662 | B2 | 8/2004 | Drowley et al. |
| 7,897,904 | B2 | 3/2011 | Johnson |
| 7,964,929 | B2 | 6/2011 | Fan |
| 7,989,749 | B2 | 8/2011 | Yin et al. |
| 8,093,541 | B2 | 1/2012 | Chen |
| 2006/0043519 | A1 | 3/2006 | Ezaki |
| 2006/0076473 | A1* | 4/2006 | Wilcken ............. H04B 10/1121 250/214 A |
| 2010/0148221 | A1* | 6/2010 | Yu .......................... B82Y 20/00 257/225 |
| 2010/0327390 | A1 | 12/2010 | McCarten |
| 2011/0025898 | A1 | 2/2011 | Ni |
| 2012/0085888 | A1 | 4/2012 | Endo |
| 2015/0129747 | A1* | 5/2015 | Petilli ............... H01L 27/14627 250/208.1 |

FOREIGN PATENT DOCUMENTS

| | | |
|---|---|---|
| FR | 2986906 | 2/2012 |
| JP | 2009182223 A | 8/2009 |
| WO | WO 2009027449 A1 | 3/2009 |
| WO | WO 2009103048 A1 | 8/2009 |
| WO | WO 2010103464 A1 | 9/2010 |

OTHER PUBLICATIONS

International Search Report (Application No. PCT/EP2013/072444), 5 pages), dated Jan. 17, 2014.

Yang Ni and Karine Matou, A CMOS Log Image Sensor With On-Chip FPN Compensation, Departement Electronique et Physique, Institut National des Telecommunications, Sep. 18-20, 2001, 4 pages.

A. Krymski, Implementing Global Shutter in a 4T Pixel, (4 pages), (2009).

\* cited by examiner

State of the art

State of the art

State of the art

State of the art

State of the art

State of the art

CMOS ACTIVE PIXEL STRUCTURE

GENERAL TECHNICAL FIELD

The present invention concerns the field of active pixels of CMOS type (Complementary Metal Oxide Semiconductor), which use a family of electronic components having low electrical consumption. In particular, the invention concerns CMOS pixel structures and image sensor arrays incorporating the same.

CMOS integration technology allows chips to be produced for monolithic cameras having good resolution and reasonable image quality. The use of these techniques also allows sensors to be obtained having low energy consumption. Such sensors also offer fast reading speed on account of the rapid switching of CMOS transistors. In addition, these technologies offer the possible integration of conditioning, processing, encoding and communication functions.

BACKGROUND OF THE INVENTION

In a conventional pixel, the electron-hole pairs generated in a photodiode are integrated in a capacitor giving either a voltage signal or an electrical charge signal.

The value of this capacitor determines the maximum charge quantity it is able to receive without saturation since the voltage applied to capacitance is always limited in a pixel. A higher value gives greater integration capacitance hence a wider dynamic range of operation. However, a high value of the integration capacitor gives a tower voltage for the same amount of integrated charge, hence lesser sensitivity. In many cases this integration capacitance is simply the capacitance of the junction of the photodiode.

A typical example of this configuration is a CMOS active pixel sensor known as an APS having three transistors as illustrated in FIG. 1. Said pixel comprises:
- a P-type semiconductor substrate 1;
- a photoelectric conversion region defined by an N-type doped region NPD forming a PN junction with the substrate and accumulating an amount of charges during exposure to light, the PN junction formed by the photoelectric conversion region and the substrate forming the cathode and anode of a photodiode;
- an insulation layer in silicon dioxide on the surface of the substrate 1;
- a readout circuit to read a variation in voltage induced by charge accumulation, said readout circuit comprising:
  - a reset transistor T1 controlled by a reset signal RST on its gate to reset the voltage of the photodiode to pre-charge, said reset transistor T1 having one electrode connected to the photoelectric conversion region NPD and another electrode connected to the power supply VDD;
  - a readout transistor T2 the gate of which is connected to the photoelectric conversion region NPD whilst one of its electrodes is connected to the power source voltage VDD;
  - a select transistor T3 controlled by a select signal SEL applicable to its gate, one of its electrodes being common with the other electrode of the readout transistor T2, and the other being connected to a readout bus COL.

The photoelectric charge is therefore self-integrated on the junction capacitance of the photodiode after the pre-charge action of the reset transistor T1, and is then read by switching of the select transistor T3. The readout sequence is illustrated in FIG. 2 which gives a typical operating chronogram of the 3-transistor CMOS active pixel illustrated in FIG. 1.

In this chronogram the following are schematically illustrated in arbitrary value as a function of time: variation 21 of the reset signal RST, variation 22 of the select signal SEL, variation 23 of the voltage VPD at the photoelectric conversion site i.e. the photodiode, and variation 24 of the voltage VCOL on the readout line COL.

At time $t_1$, the photodiode is reset or pre-charged, before imaging, at an initial voltage by means of a signal RST activating the reset transistor T1. At time $t_2$, the reset transistor T1 is deactivated and an initial readout allows determination of said initial voltage for subsequent elimination of offset of a voltage follower in the readout circuit. At time $t_3$, the select transistor T3 is deactivated by means of the select signal SEL, to allow the photodiode to operate under illumination during exposure. The accumulation of the photoelectric charge then causes a voltage drop on the photodiode (VPD). This variation in voltage is read by transistor T2 in voltage follower mode. Finally at time $t_4$, final readout occurs at the end of exposure by means of the select signal SEL, to collect the voltage representing illumination. The final output signal is the difference between the final readout and the initial readout.

It can be ascertained that the added capacitance in addition to that of the photodiode allows an increase in the saturation level limit but considerably degrades the sensitivity of the pixel. As a result, the dynamic range is not much improved. It would be more advantageous to reduce the integration capacitance to obtain good sensitivity. The saturation level limit can be controlled by exposure time, lens opening, etc.

The reduction in integration capacitance is limited by the intrinsic structure of the photodiode. It is the photodiode, via its photoelectric conversion region, which collects the photons and it is therefore not possible to reduce its surface area without losing the efficacy of photon collection, and hence without losing sensitivity. U.S. Pat. No. 6,531,725, U.S. Pat. No. 6,051,447 and U.S. Pat. No. 5,903,021 propose solutions intended to reduce the junction capacitance of the photodiode of such a pixel. These solutions use PN junctions of the photodiode of which the N-type photoelectric conversion region is partly depleted by reverse biasing.

However low capacitance of the photodiode junction entails a noise problem related to resetting of the photodiode, i.e. a switching noise KTC. This reset noise KTC perturbs proper reading of the initial voltage and cannot easily be compensated except by providing complex memory systems for example.

To improve sensitivity and to reduce noise, charge transfer CMOS active pixel structures have been proposed. As illustrated in FIG. 3, a transfer transistor TX is added to a three-transistor active pixel between the photodiode and the readout transistor T2. This transfer transistor called "transfer gate", allows transfer of the photoelectric charge accumulated in the NPD region towards a floating diffusion node FD formed by a PN junction of very small size. This floating diffusion node FD generally has low capacitance value, hence the charge-voltage conversion gain is strongly increased. By means of this charge transfer, the conversion gain is no longer related to the junction capacitance of the photodiode NPD. Said structure known as a four-transistor structure allows an increase in the sensitivity of the pixel and for example allows envisaging applications requiring strong sensitivity such as night-time vision.

A charge transfer four-transistor pixel such as illustrated in FIG. 3 has another advantage which further improves the sensitivity of the pixel. The reset transistor T1 of the photodiode injects a charge reset noise KTC into the photodiode at the time it is cut off. This noise called KTC is proportional to the square root of the KTC product where K is Boltzmann's constant, T is absolute temperature and C is the capacitance value. In a three-transistor pixel such as the one in FIG. 1, it is quite difficult to compensate for this reset noise KTC since the noise is produced at the start of exposure and the image signal is read at the end of exposure. This accounts for the low sensitivity of an image sensor formed of three-transistor pixels.

In a four-transistor pixel the situation is very different. The reading of the image signal is preceded by a reset of the floating diffusion node FD just before charge transfer. A differential operation is used to eliminate this KTC noise.

FIG. 4 gives the chronogram of a four-transistor active pixel. In this chronogram there is schematically illustrated in arbitrary value and as a function of time: the variation 41 of the reset signal RST, the variation 42 of the signal applied to the gate of the transfer transistor TX, the variation 43 of the select signal SEL, the variation 44 of the voltage VFD at the floating diffusion node FD and the variation 45 of the voltage VCOL on the readout line COL.

At time $t_1$, the floating diffusion node FD is reset, before imaging, at an initial voltage using the signal RST activating the reset transistor T1, and the select transistor T3 is switched on by means of the select signal SEL.

At time $t_2$, the reset transistor T1 is deactivated by means of the signal RST and an initial readout allows determination of said initial voltage. At time $t_3$, the transfer transistor TX is switched on to transfer the charges from the photoelectric conversion region NPD towards the floating diffusion node FD. At time $t_4$, the transfer transistor TX is deactivated, whilst a second readout takes place on the readout line. At time $t_5$, the select transistor T3 is deactivated.

The output signal is the difference between the initial readout and the second readout and is formed by the variation in voltage caused by the accumulated photoelectric charge in the photoelectric conversion region NPD which was transferred to the floating diffusion node FD. The reset noise of the floating node FD is therefore naturally offset by the differential readout circuit.

Therefore the influence of the KTC noise induced by the capacitance of the floating diffusion node FD can effectively be eliminated by differential readout, but the noise induced by the junction capacitance of the photodiode is not.

The invention of the "pinned photodiode" (PPD) allowed overcoming this difficulty. Illustrated in FIG. 3, a pinned photodiode is formed of a photoelectric conversion region, typically diffusion of N-type, forming a PN junction together with the substrate 1 and forming the photodiode, sandwiched between the substrate 1 typically of P-type and a doped region 5, also called passivation region, resulting from surface diffusion generally at very shallow depth of a heavy dose of the same type as the substrate, typically P, which insulates the photoelectric conversion region NPD from the surface of the substrate 1. When the photodiode is biased with a sufficiently high voltage, the photoelectric conversion region NPD is fully depleted of mobile charge. The spatial charges of the photoelectric conversion region NPD attract and accumulate the photoelectrons generated by the photons during the exposure time.

At the end of exposure, the transfer transistor TX transfers these photoelectrons accumulated in the photoelectric conversion region NPD to the floating diffusion node FD where they are converted to voltage. If this transfer is total, the photodiode PPD again becomes free of mobile charge. There is no generation of reset noise KTC in this case.

Total transfer of the photoelectrons is of prime importance not only to eliminate reset noise KTC but also to prevent possible image lag. The patent application filed in France under number FR 1251387 presents a structure for example allowing good functioning of the transfer transistor TX using a simple CMOS process.

One advantage of a four-transistor pixel is that the readout portion can easily be shared by several PPD photodiodes. FIG. 5 shows the principle of this sharing. Two PPD photodiodes are arranged either side of a floating diffusion node FD to which each of the PPD photodiodes can be connected by means of a transfer transistor TX1, TX2. U.S. Pat. No. 7,964,929 and U.S. Pat. No. 7,989,749 give more details on this matter. Through this possible sharing of readout amplification, pixels of very small size can currently be produced often used in cameras of mobile phones.

These different configurations of charge transfer have contributed towards improving the sensitivity limit of pixels, whilst reducing the size thereof. However, the dynamic range of operation has not at all been improved and has even regressed at times. This is because the low capacitance value of the floating diffusion node FD limits the accumulation capacity. For example the CMOS OV7955 sensor containing four-transistor pixels, of size 6 µm×6 µm, by OmniVision Technology, gives excellent sensitivity (12V/lux*s) but saturates at only 6000 photoelectrons.

To extend the dynamic range of operation and to delay saturation, approaches using multiple exposures have been used in a certain number of commercial products. These entail capturing a scene with several imaging parameters and then combining these exposures to obtain an image of with a wider dynamic range. These approaches require complex image processing. It is also often difficult in real time to find optimal imaging parameters in a changing and/or complex environment.

Documents EP 1 354 360 A1, WO 2009/027449 A1 and WO 2010/103464 A1 propose a pixel design in which the photodiode operates in photovoltaic mode, like a solar cell, contrary to conventional designs whereby the photodiode operates as a light-controlled current source. FIG. 6 shows the structure of a pixel having a photodiode in photovoltaic mode described in patent EP 1 354 360. It shows similarity to a conventional three-transistor pixel but has two fundamental differences: the photovoltaic conversion region is short-circuited during reset action and the junction of the photodiode is automatically direct-biased by the electron-hole pairs generated by the incident photons. The image signal is obtained by differential readout between photovoltaic voltage and zero voltage during reset.

In this operating mode, the voltage on the terminals of an open circuit photodiode is measured as a signal. This voltage, according to Schockley's taw, is related to light intensity via a logarithmic relationship. This logarithmic relationship compresses signal development and gives a wider dynamic range of operation. Despite its numerous advantages this photovoltaic functioning has a certain number of drawbacks in particular in terms of sensitivity, which the present invention sets out to overcome.

PRESENTATION OF THE INVENTION

It is one objective of the invention to propose a pixel structure combining a wide dynamic range of operation and good sensitivity whilst remaining of simple, compact design.

More specifically the invention proposes an active pixel structure of CMOS type, comprising:
- a semiconductor substrate of a first type;
- at least one first photodiode configured to operate in photovoltaic mode during the exposure of said first photodiode to radiation, comprising a photovoltaic conversion region defined by a doped region of a second type forming a PN junction with the substrate, said first photodiode being configured to re-emit photoelectric charge carriers captured by the PN junction during exposure of said first photodiode to radiation;
- at least one second photodiode configured to operate in integration mode and to be reverse biased during exposure of said first photodiode to radiation, said second photodiode comprising a charge accumulation region defined by a doped region of the second type forming a PN junction with the substrate, said charge accumulation region being configured to be exposed to the charge carriers originating from the photovoltaic conversion region so as to accumulate such charge carriers; and
- readout means to read the voltage of the first photodiode and to read charge measurement at the second photodiode.

In this description, the terms first type and second type relate to the type of semiconductor i.e. P-type and N-type. The first and second types are different.

Typically the first type corresponds to P-type whilst the second type corresponds to N-type. Alternatively, it is possible to have the first type corresponding to the N-type whilst the second type then corresponds to the P-type.

The exposure of the second photodiode to the charge carriers originating from the photovoltaic conversion region of the first photodiode enables it to accumulate said charge carriers which would otherwise diffuse into the substrate. The recovery of the charge carriers allows a significant improvement in the sensitivity of the pixel without compromising the wide dynamic range allowed by the first photodiode in photovoltaic mode.

The invention is advantageously completed by the following characteristics taken alone or in any technically possible combination:
- the photovoltaic conversion region and the charge accumulation region are separated by a portion of substrate through which the charge carriers re-emitted by the first photodiode pass through for collection and accumulation in the accumulation region, so that the depletion region of the PN junction of the first photodiode and the depletion region of the PN junction of the second photodiode are separate and do not touch one another;
- the substrate has spatially modulated doping defining a containment region of the charge carriers, said containment region grouping together the first and second photodiodes to contain the charge carriers and thereby promote the efficiency of collection of charge carriers from the photovoltaic conversion region by the charge accumulation region;
- the distance between the photovoltaic conversion region and the charge accumulation region is between 0.1 μm and 100 μm;
- the first photodiode(s) and the second photodiode(s) are intercalated in the substrate so that a photovoltaic conversion region lies adjacent to at least one charge accumulation region of the second photodiode;
- the photovoltaic conversion region and the charge accumulation region are at least partly superimposed;
- the charge accumulation region has a spatial extension covering at least the extent of said photovoltaic conversion region;
- the second photodiode comprises a passivation layer having same type doping as the substrate and separating the charge accumulation region from a surface of the substrate;
- a reset transistor RSTLOG is adapted to connect a reset region arranged in the substrate to the photovoltaic conversion region;
- the reset region is formed by a substrate-contact formed of a heavily doped region of the first type in the substrate;
- the reset region is formed of a second type heavily doped region biased by a variable voltage Vx, to propagate said variable voltage Vx as far as the floating diffusion node associated with the accumulation region.

Preferably, the readout means of the first photodiode and of the second photodiode comprise a readout circuit common to the first photodiode and to the second photodiode, at pixel level, connected to a common bus COL to read the voltage of the first photodiode and to read charge measurement at the second photodiode. The structure is then a charge transfer structure and in one embodiment comprises floating diffusion node associated with the charge accumulation region, and the common readout circuit comprises:
- a charge transfer structure adapted to read the voltage of a floating diffusion node associated with the second photodiode;
- a voltage offset circuit connecting the first photodiode to the floating diffusion node via a reset transistor of the charge transfer structure that is associated with the second photodiode.

The voltage offset circuit can then comprise a negative threshold voltage transistor the gate of which is connected to the photovoltaic conversion region. In another possible embodiment, the structure comprises a floating diffusion node associated with the charge accumulation region, the common readout circuit comprises a charge transfer structure adapted to read the voltage of a floating diffusion node associated with the second photodiode, and the photovoltaic conversion region is connected to the floating diffusion node by a capacitor.

The invention also concerns a sensor comprising:
- a plurality of pixel structures according to the invention; and
- at least one output circuit combining readout of the voltage of the first photodiode and readout of charge measurement at the second photodiode.

The invention also concerns an operating process of an active pixel of CMOS type having a structure according to the invention, wherein:
- the first photodiode operates in photovoltaic mode and re-emits photovoltaic charge carriers captured by the PN junction during exposure of said first photodiode to radiation;
- the second photodiode is reverse biased and operates in integration mode, said charge accumulation region being exposed to the charge carriers originating from the photovoltaic conversion region so as to accumulate said charge carriers;
- the voltage of the first photodiode and a charge measurement at the second photodiode are read by the readout means.

BRIEF DESCRIPTION OF THE FIGURES

Other characteristics and advantages of the invention will become further apparent from the following description given solely for illustration purposes and is non-limiting. This description is to be read in connection with the appended drawings in which.

DETAILED DESCRIPTION

Figure 7:
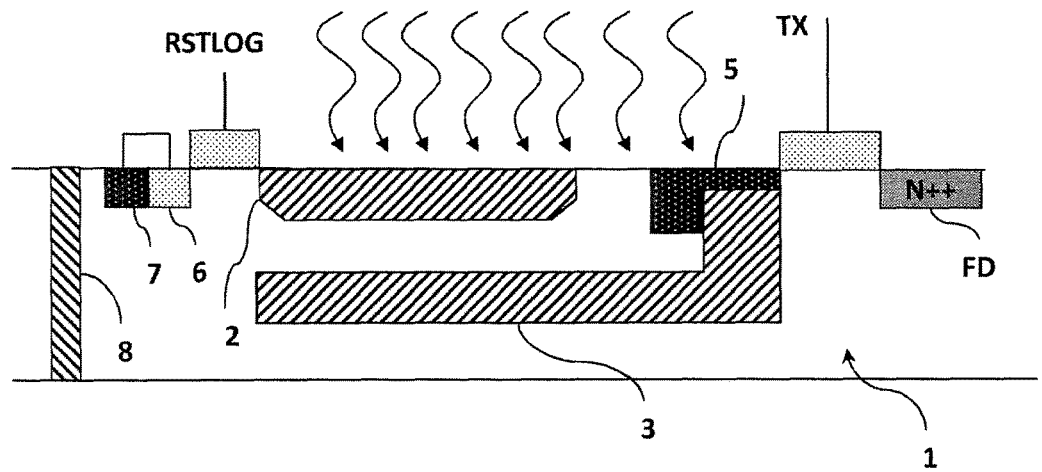
FIG. 7 is a cross-sectional diagram illustrating one possible embodiment of a pixel structure according to the invention.

With reference to FIG. 7, an active pixel structure of CMOS type according to one possible embodiment of the invention, comprising:

a semiconductor substrate 1 of a first type;

at least one first photodiode operating in photovoltaic mode comprising a photovoltaic conversion region 2 defined by a doped region of a second type forming a PN junction with the substrate, said first photodiode re-emitting photoelectric charge carriers captured by the PN junction during exposure of said first photodiode to radiation;

at least one second photodiode operating in integration mode and reverse biased, said second photodiode comprising a charge accumulation region 3 defined by a doped region of the second type forming a PN junction with the substrate, said charge accumulation region being exposed to the charge carriers originating from the photovoltaic conversion region 2 so as to collect and accumulate said charge carriers.

The structure of the pixel of the present invention groups together a photodiode in photovoltaic mode, a photodiode in integration mode, and charge coupling between the photodiode in photovoltaic mode and the photodiode in integration mode.

Figure 8:
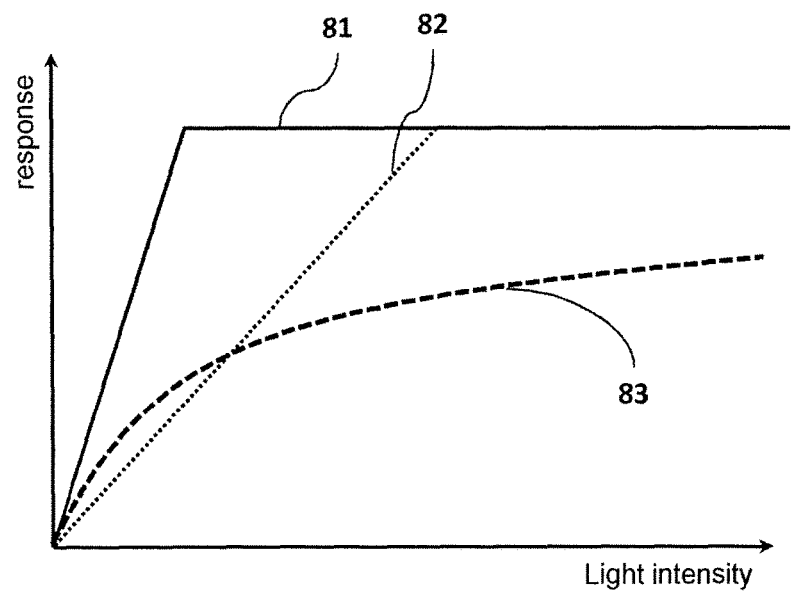
FIG. 8 is a graph schematically illustrating responses of the photodiodes in photovoltaic mode and integration mode respectively, as a function of the light intensity to which they are subjected.

FIG. 8 shows the photodiode responses in photovoltaic mode and integration mode respectively, as a function of the tight intensity to which they are subjected. The curve with the continuous line 81 illustrates the response of a photodiode in integration mode during long exposure, whilst the dotted curve 82 illustrates the response of this photodiode during short exposure. It can be seen that a photodiode in integration mode rapidly exhibits saturation which prevents the sensing of light intensities that are too strong.

The dashed curve 83 illustrates the voltage response of the photodiode in photovoltaic mode i.e. self-direct-bias. It can be seen that the voltage response takes on a logarithmic shape allowing even strong light intensities to be sensed.

Therefore a photodiode in integration mode and a photodiode in photovoltaic mode are highly complementary: the photodiode in photovoltaic mode offers a very wide dynamic range of operation but lesser sensitivity to light, whilst the photodiode in integration mode has excellent sensitivity in particular for a pinned photodiode four-transistor pixel, but a very narrow dynamic range. A combination of these photodiodes therefore allows a high performance pixel to be obtained both regard to sensitivity and to dynamic range.

A photodiode pre-charged at a nonzero reverse bias voltage before exposure can generate a response which would change over from integration mode to photovoltaic mode. In fact the operating of a photodiode in photovoltaic mode can exist and can be seen in a conventional CMOS sensor when the amplifier in the pixel allows readout of the negative voltage on the cathode of the photodiode.

However, this configuration is generally not recommended in prior art array configurations since the photodiodes in integration mode will collect the charges released by neighbouring photodiodes which are in photovoltaic mode, and in this case the charges released by the photodiodes in photovoltaic mode will flaw the photodiodes still reverse biased (i.e. in integration mode) and will render the image unusable. The result will be unacceptable crosstalk between the photodiodes. This accounts for the lack of investigation into pixels with photodiodes in photovoltaic mode before the research work published in "Y. Ni, K. Matou, "A CMOS Log Image Sensor with on-chip FPN Compensation", ESSCIRC'01, 18-20 Sep. 2001 Villach, Austria, pp. 128-132" and described in patent EP1354360.

In the invention this effect is not avoided but sought after, and the pixel structure is adapted to generate this collecting effect by a photodiode in integration mode of charge carriers re-emitted by a photodiode in photovoltaic mode.

This pixel therefore generates two image signals: one is logarithmic, generated by the photodiode in photovoltaic mode (Slog) and the other is linear generated by the photodiode in integration mode (Sint). These two image signals can be used in different manners in an image sensor provided with such pixels, in a camera system provided with such image sensors. For example, the signal Slog can be used when there is strong light dynamics in the scene and the signal Sint when the scene is dark. It is also possible to combine these two signals using a fixed or adaptive mathematical formula to provide a single image. It is also possible if processing power so permits, to perform local combinations between these two images in relation to local settings.

Some amount of proximity between a photodiode operating in photovoltaic mode and a photodiode operating in integration mode allows good collection and hence better accumulation by a photodiode operating in integration mode of the photoelectric charges emitted by a photodiode operating in photovoltaic mode.

However, so as not to hamper their respective functions, the photovoltaic conversion region 2 and the charge accumulation region 3 are separated by a portion of substrate through which the charge carriers re-emitted by the first photodiode pass through in order to be collected and accumulated in the accumulation region, so that the depletion region of the PN junction of the first photodiode operating in photovoltaic mode and the depletion region of the PN junction of the second photodiode are separate and do not touch one another.

Therefore the distance between the photovoltaic conversion region 2 of the first photodiode and the charge accumulation region 3 of the second photodiode is between 0.1 μm and 100 μm, and preferably between 0.1 μm and 30 μm.

In the embodiment illustrated in FIG. 7, the photovoltaic conversion region 2 and the charge accumulation region 3 are overlaid so that the photovoltaic conversion region 2 lies on the surface of the substrate 1, whilst the charge accumulation region is chiefly located in the core of the substrate 3. In this embodiment, the charge accumulation region 3 has a spatial extension covering at least in part the extent of said photovoltaic conversion region 2. Preferably coverage is total and even exceeds beyond the extent of said photovoltaic conversion region 2 and therefore part of the light rays are able to reach the charge accumulation region 3 via a direct pathway without having to pass through the photovoltaic conversion region 2 as illustrated in the case in FIG. 7.

Figure 9:
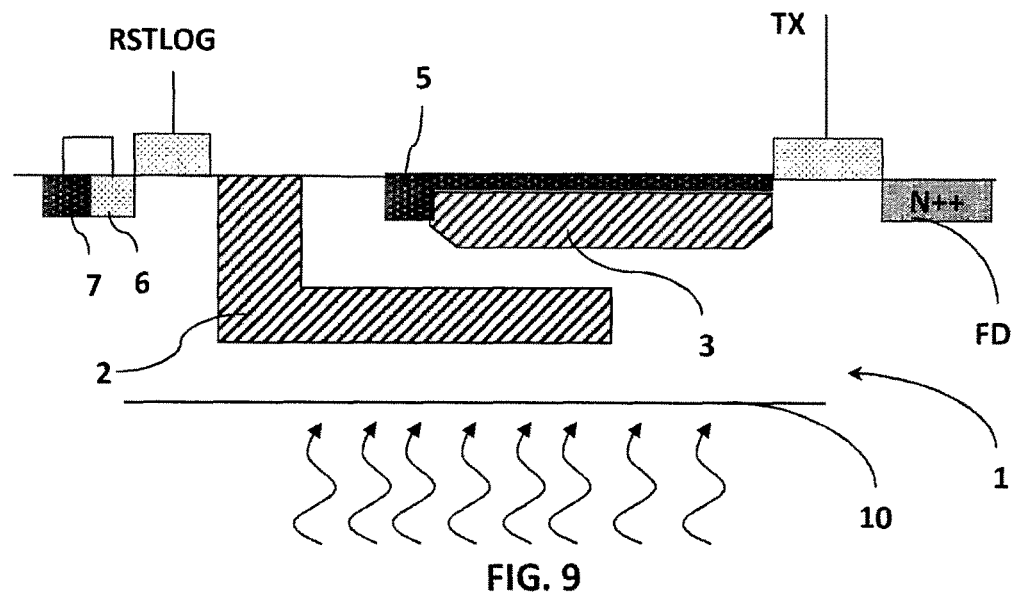
FIG. 9 is a cross-sectional schematic illustrating one possible embodiment of a pixel structure according to the invention, wherein exposure occurs via the back surface of the substrate.

This overlaying could however be only partial. This is notably the case in an embodiment in which illumination occurs via the back surface 10 of the substrate 1, as illustrated in FIG. 9. In this case, the photovoltaic conversion region 2 is chiefly located in the substrate 1, whilst the charge accumulation region 3 is on the surface of the substrate 1, although it is insulated from the surface by a doped region 5 also called a passivation region, resulting from surface diffusion generally at very shallow depth of a heavy dose of the same type as the substrate e.g. P+ if the substrate is of P-type, and which insulates the charge region 3 from the surface of the substrate 1. In this case also, on account of the non-partial nature of the overlay, some of the light rays via a direct pathway reach the charge accumulation region 3 without passing through the photovoltaic conversion region 2. The embodiment in FIG. 9 otherwise reproduces the same elements as illustrated in FIG. 7.

The overlaying of the photovoltaic conversion region 2 of the first photodiode and the charge accumulation region 3 of the second photodiode can be easily performed by persons skilled in the art using:

different energy levels during ion implantation, and/or
ions of different weights.

Figure 10:
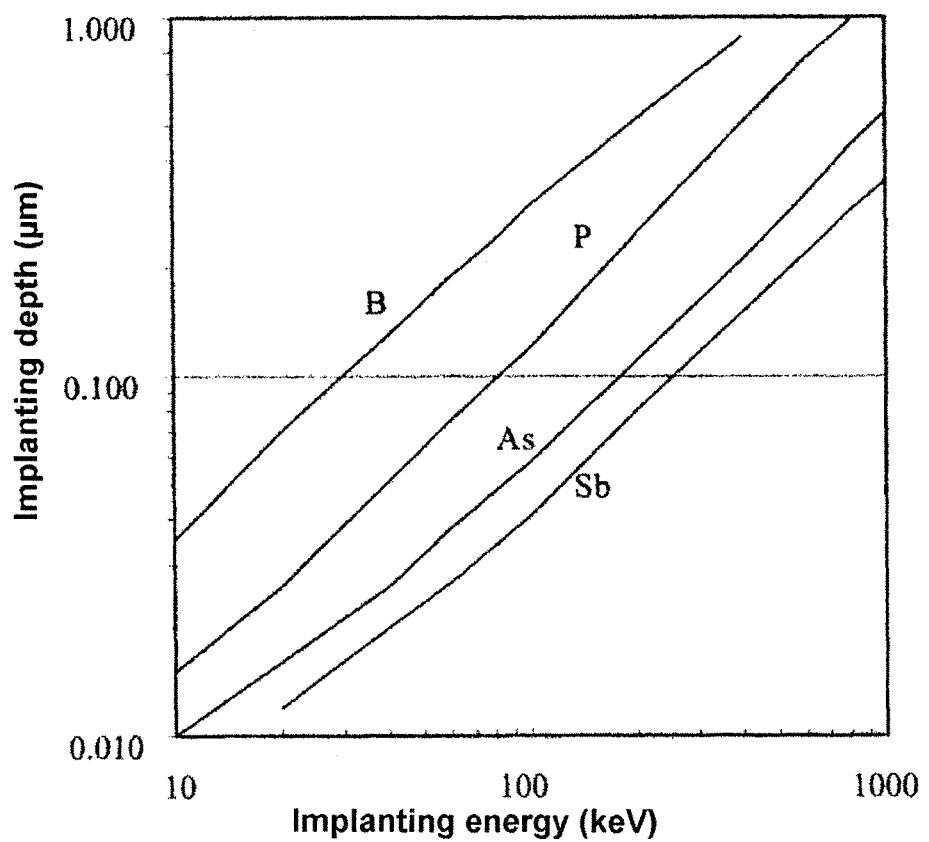
FIG. 10 is a graph illustrating implanting depths of different dopant species as a function of implanting energy.

For example, for N-type doping, it is generally possible to use phosphorus ions (lightweight) or arsenic ions (heavy). FIG. 10 shows the implanting depth in μm of different ions in relation to their implanting kinetic energy in keV.

For example, the photovoltaic conversion region 2 of the photodiode in photovoltaic mode can be conducted by arsenic implantation at 150 keV and the charge accumulation region 3 of the photodiode in integration mode by phosphorus implantation at 800 KeV in a boron-doped substrate at a dose of $1 \times 10^{15}$ cm$^{-2}$. The passivation layer 5 can be obtained by $BF_2$ implantation at 10 keV at a dose of $10^{13}$ cm$^{-2}$. The book "Introduction to Semiconductor Manufacturing Technology" written by Hong Xiao and published by Prentice Hall (ISBN 0-13-191136-8) gives all necessary information for such implantation.

The structures illustrated in FIGS. 7 and 9 also comprise a reset transistor RSTLOG adapted to connect a reset region 7 arranged in the substrate to the photovoltaic conversion region 2. For example, the reset region 7 is formed by a substrate-contact formed of a heavily doped region of the first type in the substrate 1. The drain 6 of the reset transistor RSTLOG together with the substrate-contact 7 forms a short-circuited PN junction.

The substrate 1 may also have spatially modulated doping 8 defining a containment region for the charge carriers, said containment region grouping together the first and second photodiode to contain the charge carriers and promote efficiency of the collecting of charge carriers originating from the photovoltaic conversion region 2 by the charge accumulation region 3. This spatially modulated doping 8 allows the charge carriers to be contained in said containment region, and hence the containing thereof in a region in which they are able to be collected by the charge accumulation region 3. The exposure of the charge accumulation region 3 to the charge carriers originating from the photovoltaic conversion region 2 is thereby improved. This modulated doping 8 also allows a reduction in cross-talk between pixels. Spatially modulated doping is typically a region with a higher concentration of dopants than the substrate 1, and extends into the depth of the substrate 1 from the surface thereof.

The first photodiode and the second photodiode can be read for example by two amplifiers, or else by a single amplifier equipped with an input selector. The advantage of this arrangement is better coupling between the photodiode(s) in solar-cell mode and the photodiode(s) in integration mode. Readout of the photodiode in integration mode can be made either by direct voltage readout on the photodiode (three-transistor pixel) or charge transfer readout on a floating diffusion node FD (four-transistor pixel), as previously described. Documents EP1354360, US2011/0025898 and EP2186318 also describe readout structures which can be used.

Figure 1:
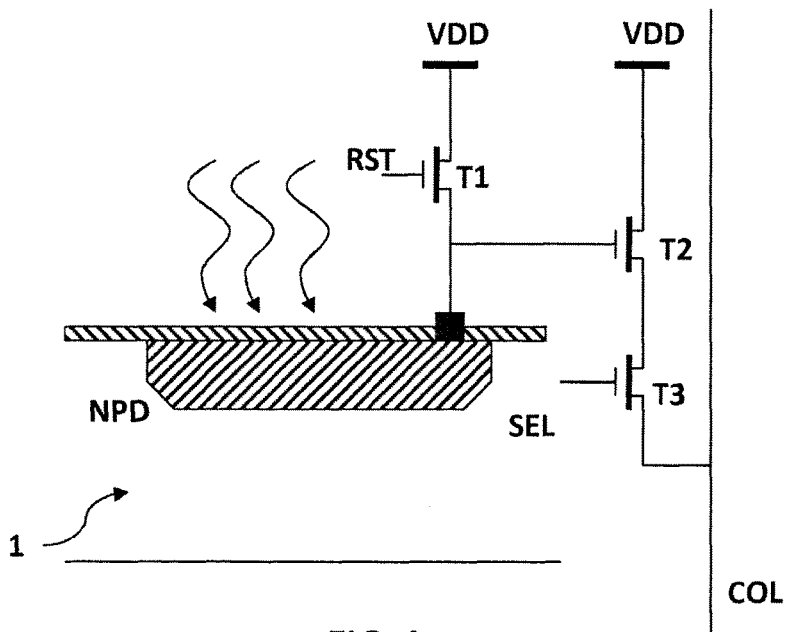
FIG. 1, already commented upon, is a schematic illustrating the structure of a three-transistor active pixel of the state of the art.
Figure 2:
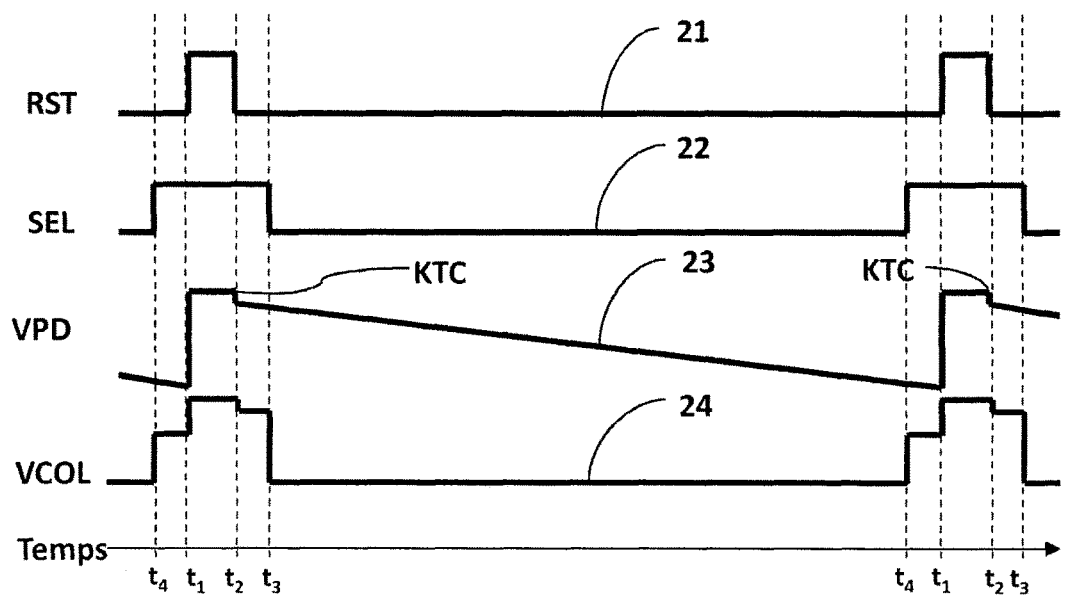
FIG. 2, already commented upon, is a chronogram illustrating the signals occurring during the functioning of the pixel in FIG. 1.
Figure 3:
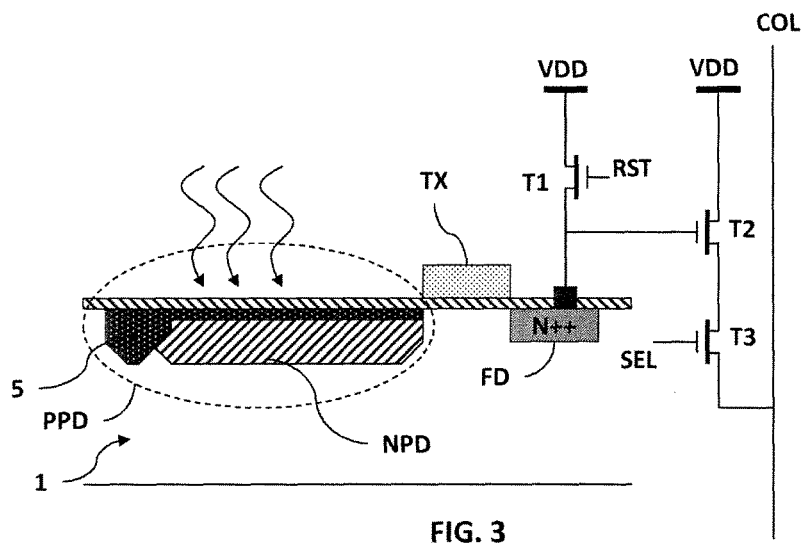
FIG. 3, already commented upon, is a schematic illustrating the structure of a four-transistor active pixel of the state of the art.
Figure 4:
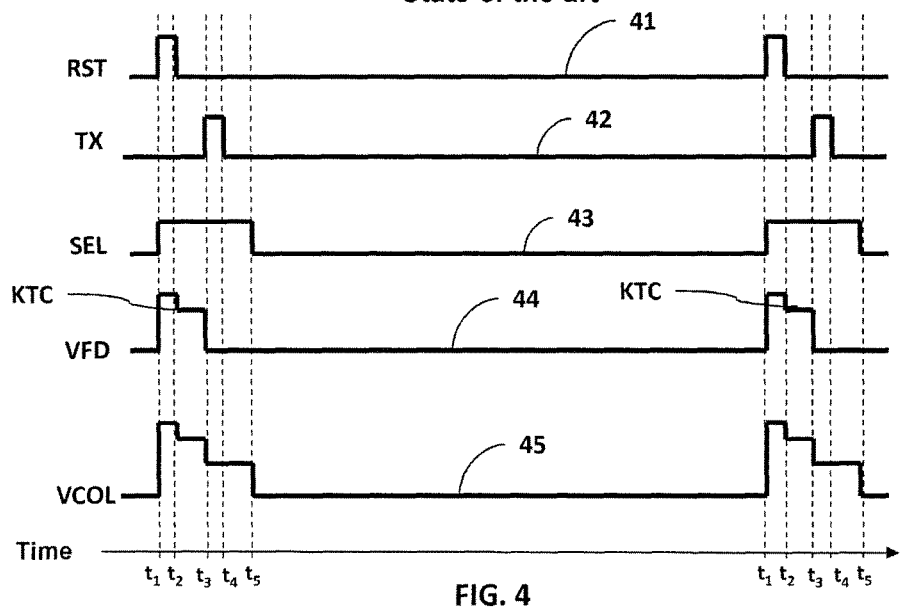
FIG. 4, already commented upon, is a chronogram illustrating the signals occurring during the functioning of the pixel in FIG. 3.

In the embodiments illustrated in FIGS. 7 and 9, the readout portion of the pixel structure is similar to the one illustrated in FIG. 3. A transfer transistor TX controls and defines a transfer channel in the substrate 1 via which the charge carriers, from the charge accumulation region 3, are able to reach a floating diffusion node FD on which readout will be performed.

Figure 11:
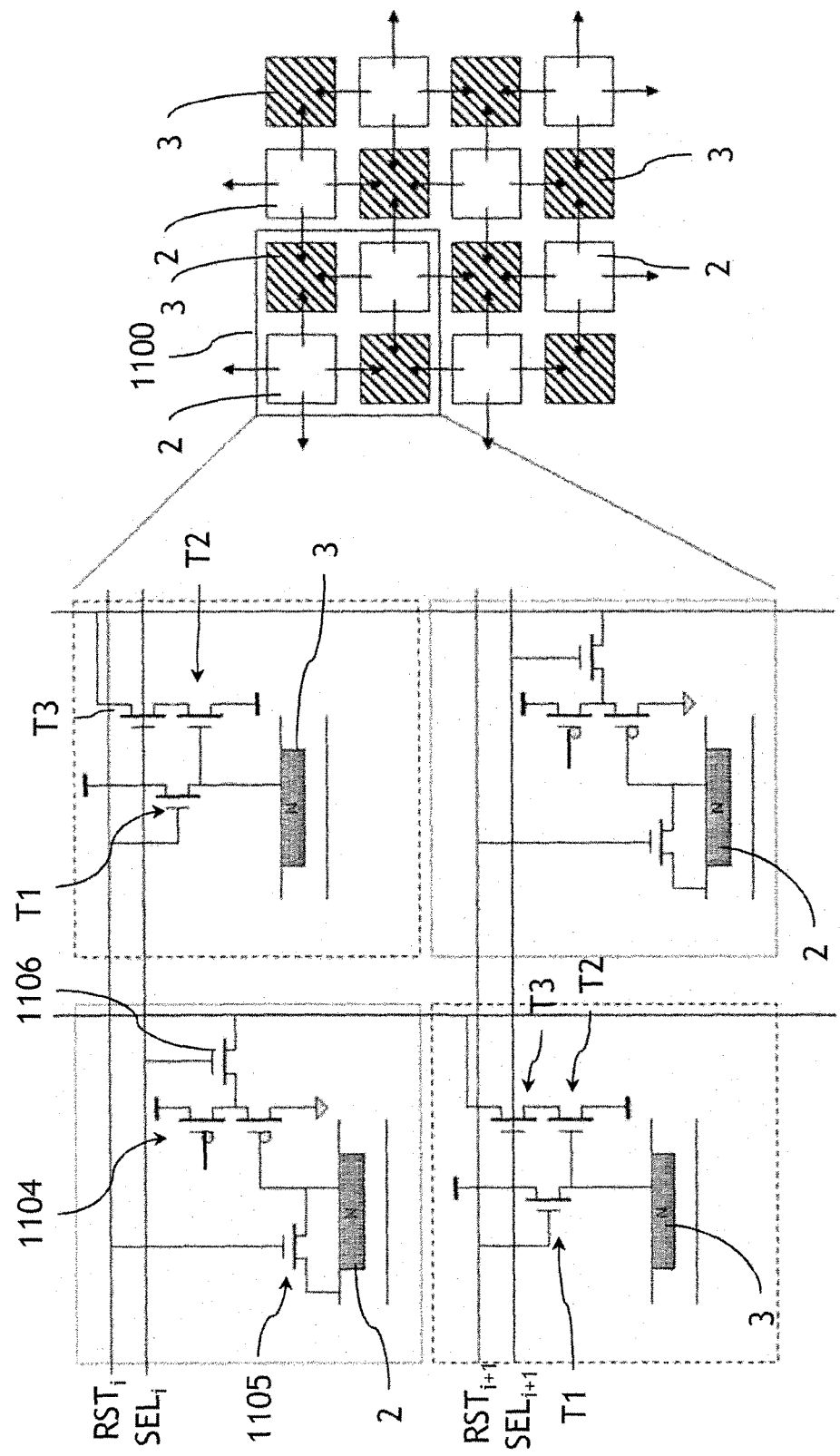
FIGS. 11 and 12 on the right side give an overhead view of a pixel array and on the left side a magnified view of a pixel according to one possible embodiment of the invention.

Another embodiment illustrated in FIG. 11 allows the use of existing structures known and used by persons skilled in the art. In this pixel structure the first photodiode(s) and the second photodiode(s) are intercalated in the substrate so that a photovoltaic conversion region 2 lies adjacent to at least one charge accumulation region 3.

FIG. 11 on the right side illustrates a pixel array and on the left side a magnified view of a pixel 1100 comprising two first photodiodes operating in photovoltaic mode each comprising a photovoltaic conversion region 2 defined by a doped region forming a PN junction with the substrate, and two second photodiodes operating in integration mode and reverse biased each comprising a charge accumulation region 3 defined by a doped region forming a PN junction with the substrate.

The readout means to read the voltage of the first photodiode and to read charge measurement at the second photodiode may comprise a first circuit to read the voltage of the first photodiode and a second readout circuit to read charge measurement at the second photodiode.

The first photodiodes, in photovoltaic mode, are each read by a circuit similar to the one described in document EP 1 354 360. The PN junction of the first photodiode is formed by a P-type semiconductor substrate on which N-type diffusion is performed to form the photovoltaic conversion region 2.

Said circuit comprises a buffer amplifier 1104 with infinite input impedance under direct current, to the input terminals of which the PN junction of the first photodiode is connected. The buffer amplifier 1104 is formed of two MOS, P-channel field effect transistors in series, supplied with a power source voltage, the first transistor acts as bias current source with its gate connected to a voltage allowing adjustment of this bias current.

The circuit further comprises a switch 1105 capable of selectively creating a short circuit of the PN junction to simulate a darkness condition. The switch 1105 and the select switch 1106 are formed by MOS field effect N-channel transistors.

The second photodiodes, in integration mode, are each read by a three-transistor circuit such as previously described.

Figure 12:
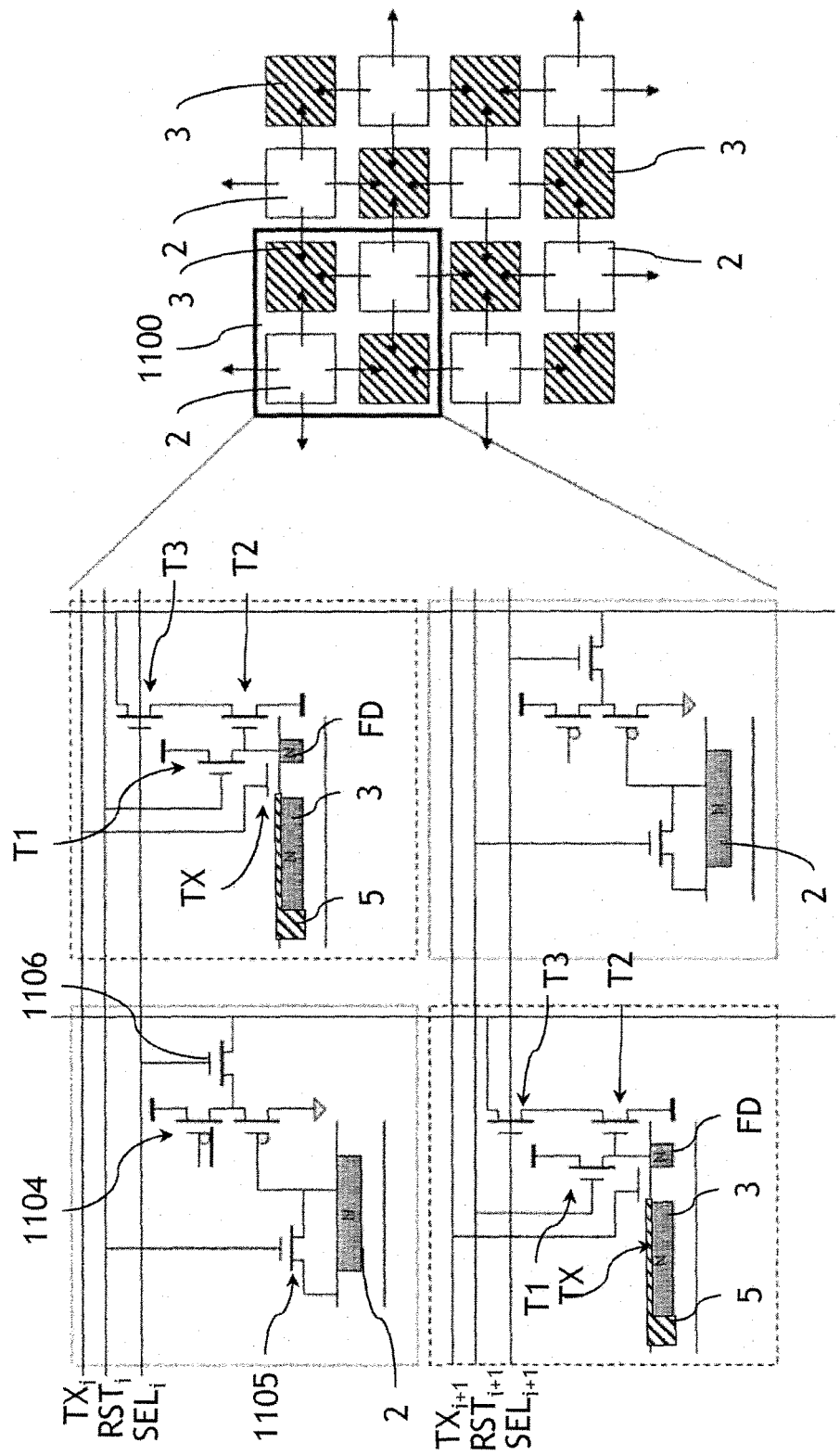

FIG. 12 shows a variant of this embodiment with four-transistor photodiodes in integration mode, the circuits associated with the photodiodes in photovoltaic mode remaining the same. This four-transistor circuit operates in similar manner to the circuit described in connection with FIG. 3, with a transfer transistor TX controlling and defining a charge transfer channel between the charge accumulation region 3 of the photodiode operating in integration mode and a floating diffusion node FD. This transfer transistor TX is controlled by means of a transfer signal $TX_i$.

The voltage at the floating diffusion node FD is read by a readout transistor T2 the gate of which is connected to the floating diffusion node FD. A select transistor T3 controlled on its gate by a select signal $SEL_i$ allows the selective transmission of the photodiode readout to a bus $COL_j$. A reset transistor T1 controlled on its gate by a reset signal $RST_i$ allows resetting of the voltage of the floating diffusion node FD at a reset voltage.

These two embodiments function in similar manner. The first photodiodes re-emit photoelectric charge carriers captured by the PN junction during exposure of said first photodiode to radiation. The second photodiodes comprise a charge accumulation region defined by a doped region forming a PN junction with the substrate, said charge accumulation region being exposed to the charge carriers originating from the photovoltaic conversion region so as to accumulate said charge carriers. This circulation of charge carriers is symbolised by arrows on the right side of FIGS. 11 and 12.

Having regard to the small size of a pixel, the photoelectric charge released by a solar-cell photodiode i.e. photovoltaic, could easily pass through several pixels. For example, in a P-doped silicon substrate at a dose of $1 \times 10^{15}$ $cm^{-3}$, the mobile charge diffusion length can be as long as several hundred micrometers, whilst most pixels are of size smaller than 10 μm×10 μm. In this case, one simple solution is to arrange two populations of photodiodes in one pixel, or alternatively two populations of pixels each formed of one type of photodiode in an array so that the charges released by the pixels in solar cell mode are captured laterally by the pixels in integration mode located in the vicinity preferably adjacent, i.e. the closest neighbours.

At the output of a said array we therefore have two sub-images: a logarithmic sub-image derived from the photodiodes in solar cell mode and a linear sub-image derived from the photodiodes in integration mode.

Particular attention must be given to the saturation of the photodiodes in integration mode. If the second photodiode in integration mode is allowed to accumulate too much charge, the second photodiode will in turn end up by entering into photovoltaic mode, also called solar cell mode, and will flaw the adjacent second photodiodes of neighbouring pixels.

Figure 13:
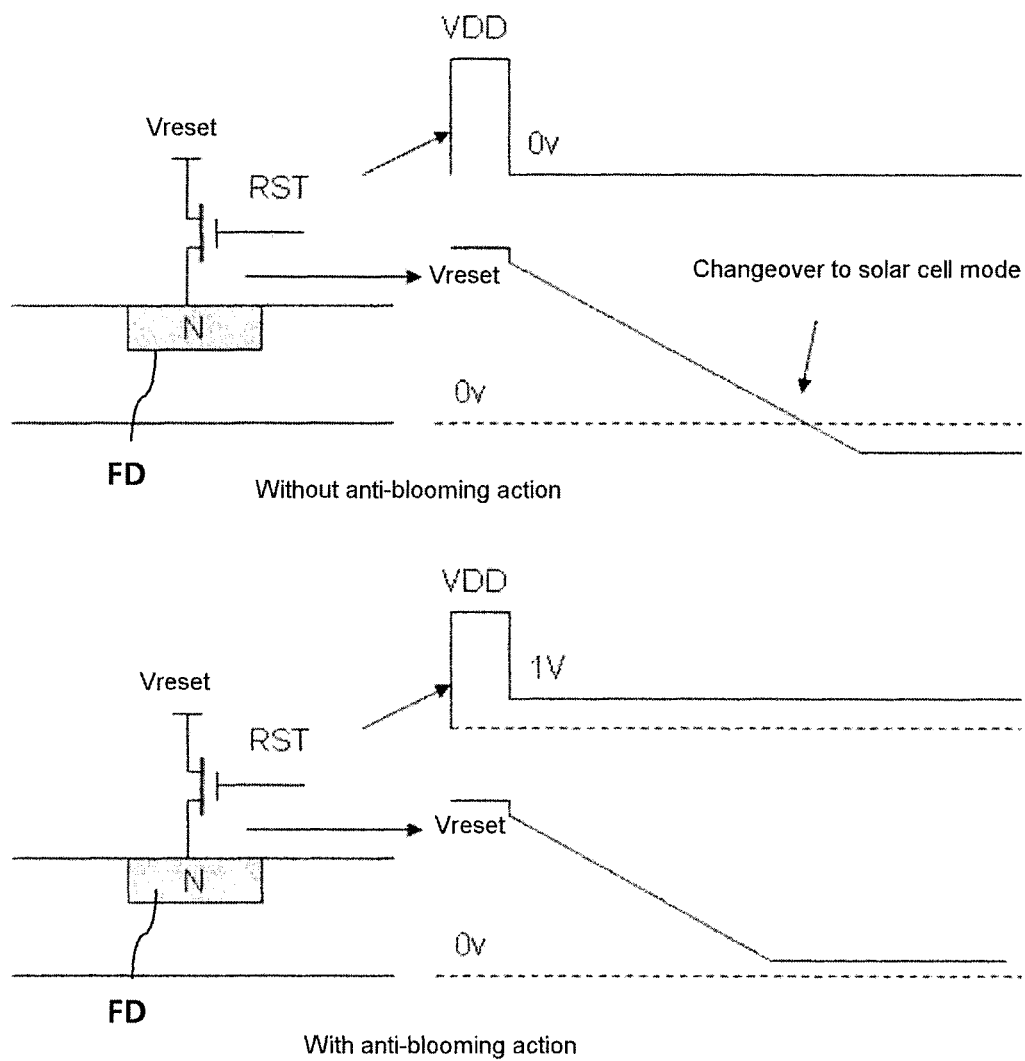
FIG. 13 illustrates the principle of the anti-blooming action implemented for a three-transistor pixel.

Therefore the so-called anti-blooming function must be activated, preferably in the photodiodes in integration mode, to prevent these from entering into photovoltaic mode. With a three-transistor circuit as in FIG. 11, the anti-blooming action is obtained simply via the waveform used for the reset signal RST. FIG. 13 shows the principle of anti-blooming action via the RST signal. It simply consists of controlling the reset transistor with a reset signal RST of tow level (for an N-type channel reset transistor) that is nonzero instead of zero when the reset transistor T1 is not activated. In the example in FIG. 13, the RST signal is held at 1V or higher so that the voltage at the floating diffusion node FD does not become negative. In this case, the excess charge created by the photodiode in integration mode is drained by the reset transistor T1 towards the power supply.

The anti-blooming function is also preferably used in four-transistor photodiodes to prevent blooming in an array. The technical article "Implementation global shutter in a 4T pixel" by A. Krymski at the International Conference: Image Sensor Workshop in 2009 gives a description of the blooming phenomenon in a four-transistor pixel in integration mode and also an efficient method for the prevention thereof. Similarly U.S. Pat. No. 7,897,904, U.S. Pat. No. 8,093,541 and U.S. Pat. No. 6,777,662 provide solutions based on a fifth transistor to drain excess charges towards the power supply.

The previously described embodiments have recourse to functional mixing between photodiodes in solar-cell mode and photodiodes in integration mode. These embodiments have the major advantage of being able to make use of existing proven structures. However one disadvantage lies in the fact that the spatial resolution of a photodiode array is divided into two for each operating mode, compared with overlaid structures as previously described. In addition, the readout circuits of the photodiodes remain independent and non-optimised. The total number of transistors for a composed pixel (in solar cell mode and integration mode) can therefore exceed ten transistors, which leads to problems of compactness and cost.

Another embodiment proposes a remake of the readout circuits both for the photodiode in solar cell mode and for the photodiode in integration mode. Having regard to performance in tow light levels, the following description is restricted to structures having recourse to a charge transfer PPD photodiode.

Figure 14:
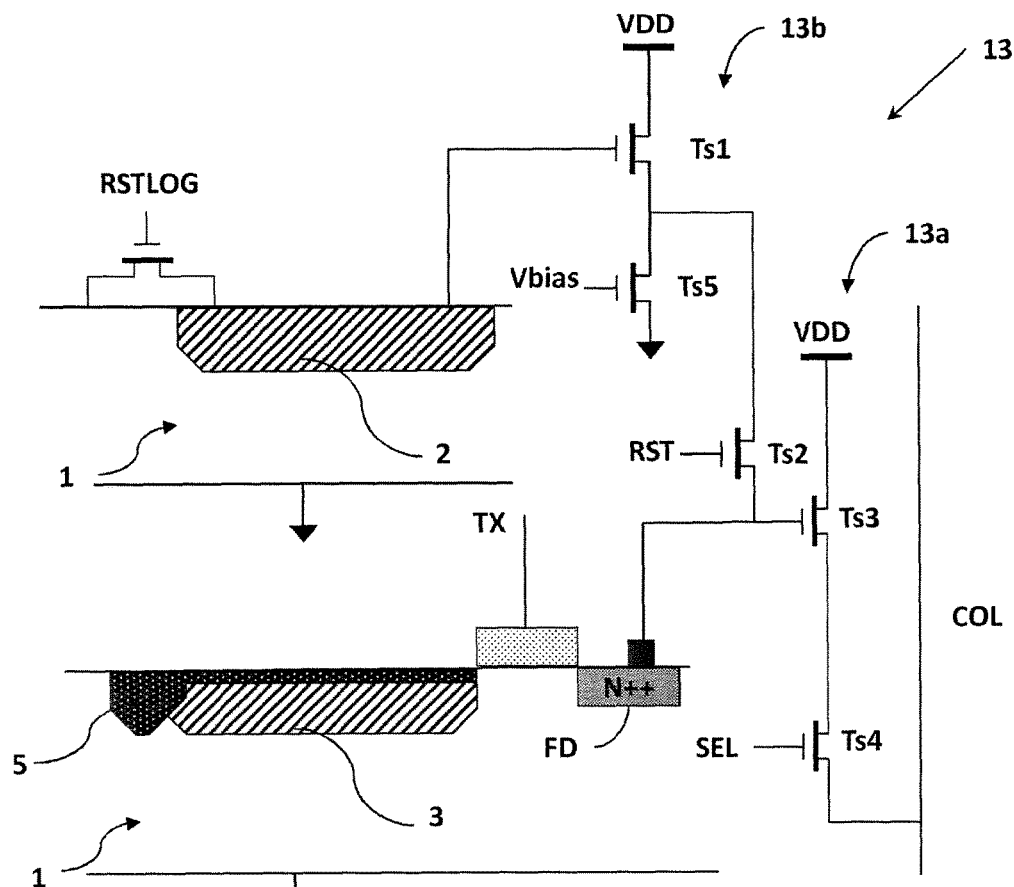
FIGS. 14 and 15 respectively give the wiring diagram and a cross sectional view of an arrangement of the regions of a pixel structure according to one possible embodiment of the invention in which the two photodiodes are read by a common circuit.
Figure 15:
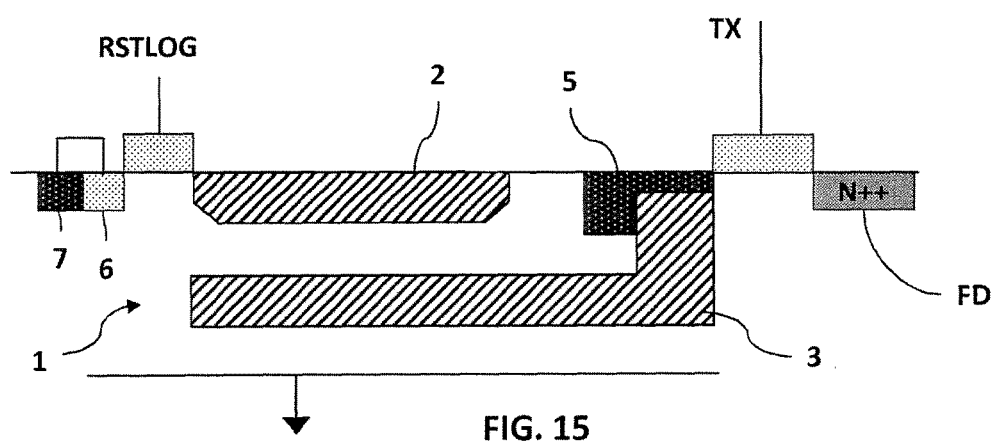

FIG. 14 illustrates the wiring diagram of one possible embodiment of a pixel structure according to the invention, whilst FIG. 15 gives a cross-sectional view of the arrangement between the first photodiode and the second photodiode in this embodiment.

The configuration of the photodiodes in this pixel structure of this embodiment is similar to the one in FIG. 7 but it is only a non-limiting example, other configurations such as those in FIG. 9 or those in FIGS. 11 and 12 being able to be used.

For example, in the embodiment illustrated in FIGS. 14 and 15, the structure of an active pixel of CMOS type comprises:
- a semiconductor substrate 1 of a first type;
  - at least one first photodiode operating in photovoltaic mode comprising a photovoltaic conversion region 2 defined by a doped region of a second type forming a PN junction with the substrate, said first photodiode re-emitting photoelectric charge carriers captured by the PN junction during exposure of said first photodiode to radiation;
  - at least one second photodiode operating in integration mode and reverse biased, said second photodiode comprising a charge accumulation region 3 defined by a doped region of the second type forming a PN junction with the substrate, said charge accumulation region being exposed to the charge carriers originating from the photovoltaic conversion region 2 so as to accumulate such charge carriers.

In the illustrated example, the photovoltaic conversion region 2 and the charge accumulation region 3 are overlaid in the substrate 1. A doped region 5, also called passivation region, resulting from surface diffusion at very shallow depth of a heavy dose of the same type as the substrate e.g. P-type, insulates the charge accumulation region 3 from the surface of the substrate 1.

Instead of a first circuit to read the voltage of the first photodiode and of a second circuit to read a charge measurement at the second photodiode, the readout means to read the voltage of the first photodiode and to read a charge measurement at the second photodiode may comprise a common readout circuit 13 at pixel level.

The first photodiode and the second photodiode therefore have a common readout circuit 13 at the pixel level connected to a common bus COL to read the voltage of the first photodiode and to read a charge measurement at the second photodiode.

The transistors of this common readout circuit 13 are preferably all N-type transistors. P-type transistors are indeed more bulky than those of N-type and their use would increase the bulk of the pixel. In addition, the absorption of the charge carriers by the charge accumulation region 3 makes it possible to do without an insulating compartment and to use N-type transistors to reduce the bulk of the readout circuit and hence of the pixel.

The common readout circuit 13 comprises:
- a charge transfer structure 13a adapted to read the voltage of a floating diffusion node associated with the second photodiode;
- a voltage offset circuit 13b connecting the first photodiode to the floating diffusion node via a reset transistor Ts2 of the charge transfer structure 13a.

In the example illustrated in FIG. 14, the voltage offset circuit 13b comprises a transistor Ts1 of N-type with negative threshold voltage the gate of which is connected to the photovoltaic conversion region 2, and another transistor Ts5 of N-type the gate of which is biased with a voltage Vbias. The transistor Ts1 has a drain connected to the supply voltage VDD, and its source is connected to the drain of the other transistor Ts5 and to the drain of the reset transistor Ts2 belonging to the charge transfer structure 13a.

This charge transfer structure 13a therefore comprises the transistor Ts2, controlled on its gate by a reset signal RST and via which said charge transfer structure 13a is connected to the voltage offset circuit 13b. The charge transfer structure 13a also comprises a readout transistor Ts3 of N-type, also called a follower amplifier, the gate of which is connected to the source of the reset transistor Ts2 and to the floating diffusion node FD. A transfer transistor TX of N-type allows charge transfer from the charge accumulation region 3 to the floating diffusion node FD. Finally, the source of the readout transistor Ts3 is connected to the drain of the select transistor Ts4 via which the readout circuit 13 is able to be connected to the readout bus COL.

Figure 16:
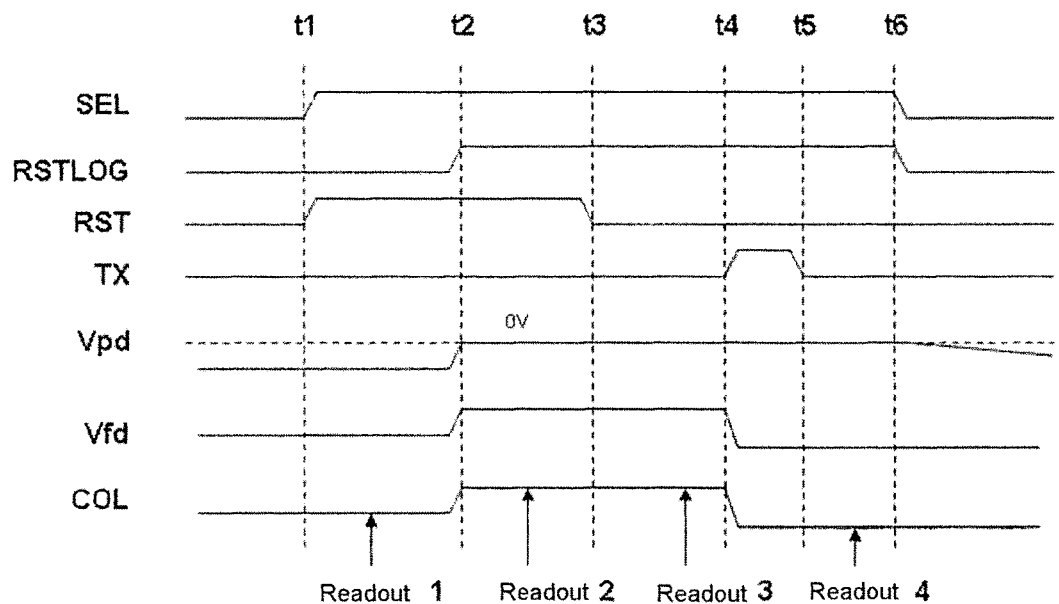
FIG. 16 is a chronogram illustrating the functioning of the structure in FIGS. 14 and 15.

The functioning of this pixel structure is described with the help of the chronogram schematised in FIG. 16. The select signal SEL is applied to the gate of the select transistor Ts4 of N-type, the reset signal of the photovoltaic conversion region RSTLOG is applied to the gate of the reset transistor of the photovoltaic conversion region 2, the reset signal RST is applied to the gate of the transistor Ts2 of N-type, the transfer signal TX is applied to the gate of the transfer transistor TX of N-type. The voltage Vpd corresponds to the voltage at the photovoltaic conversion region 2, the voltage Vfd corresponds to the voltage at the floating diffusion node and the voltage COL corresponds to the voltage on the common bus COL.

At time t1, the select signal SEL is activated (high level), the select transistor Ts4 is switched on and the follower amplifier transistor Ts3 is connected to the readout bus COL. At the same time the reset signal RST is also placed at high level. The transfer transistor TX being deactivated, the floating diffusion node FD is connected to the output of the readout buffer of the first photodiode in photovoltaic mode formed by the voltage offset circuit 13b. A first readout is then obtained on the readout bus COL (Readout1).

Next, at time t2, the reset signal RSTLOG of the photovoltaic conversion region 2 is activated to high level, the photodiode in photovoltaic mode is then short-circuited and a second readout is performed (Readout 2). The difference between Readout 1 and Readout 2 gives the logarithmic response of the photodiode in photovoltaic mode.

At time t3, the reset signal RST is deactivated i.e. changes to tow level, and the floating diffusion node FD becomes isolated. A third readout is performed to read the reset level on the floating diffusion node FD (Readout 3).

At time t4, the photoelectric charge accumulated on the second photodiode in integration mode is transferred to the floating diffusion node FD via action of the transfer transistor TX. This charge transfer causes a voltage drop on the floating diffusion node FD.

At time t5, the transfer transistor is deactivated and a fourth readout (Readout 4) is performed to measure the voltage at the floating diffusion node FD. The difference between Readout 3 and Readout 4 gives a linear response of the second photodiode.

Finally at time t6, the signals RSTLOG and SEL are replaced at low level, and exposure is recommenced.

In the embodiment illustrated in FIGS. 14 and 15, the photodiodes are overlaid. The first photodiode, in photovoltaic mode, is implanted with ions at shallow depth and the second photodiode in integration mode is implanted at a greater depth in the substrate. The processing of the readouts of these photodiodes is similar to that in the preceding embodiments. This structure may require minor modifications to a standard CMOS process but offers many more advantages, in particular better coupling between the two types of photodiodes and greater compactness of the pixel allowing improved resolution to be envisaged.

In this configuration, the transistor Ts1 must have a negative threshold voltage (depletion transistor) to generate a positive voltage at the output of the buffer, i.e. of the voltage offset circuit 13b. This threshold voltage must be sufficiently negative so that when the first photodiode in photovoltaic mode is short-circuited there is adequate voltage for resetting of the floating diffusion node FD.

The transistor Ts2, when it is switched on, must have a threshold voltage allowing transmission from the buffer output i.e. from the voltage offset circuit 13b, to the floating diffusion node FD. The transistor Ts3 must have an adequate threshold voltage so that it is able to recopy the voltage of the floating diffusion node FD to the bus COL with good linearity. These threshold voltages can be obtained by additional ion implantation on these transistors.

Figure 17:
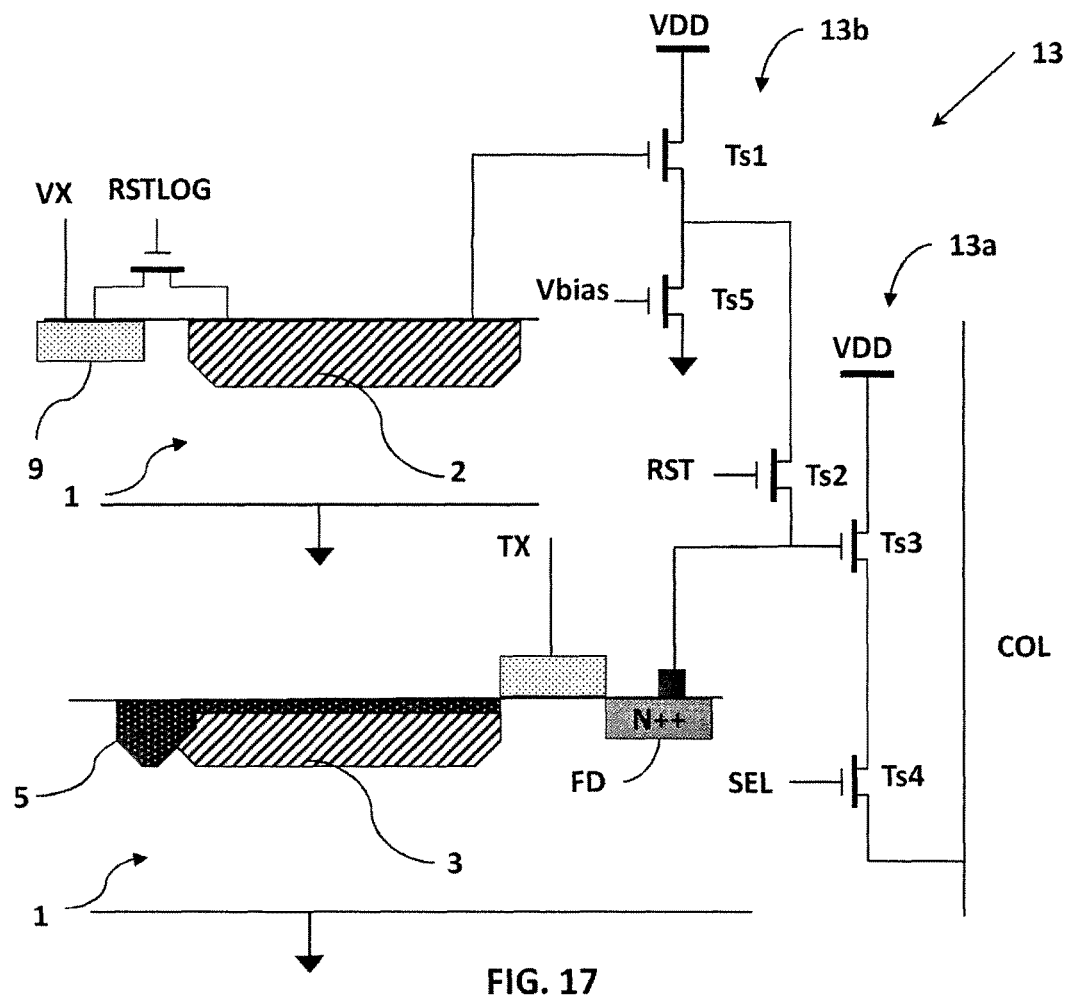
FIGS. 17 and 18 respectively give the wiring diagram and a cross-sectional view of an arrangement of the regions of a pixel structure according to one possible embodiment of the invention with a variant in which a voltage is applied to the photovoltaic conversion region instead of short-circuiting the region for the resetting thereof.
Figure 18:
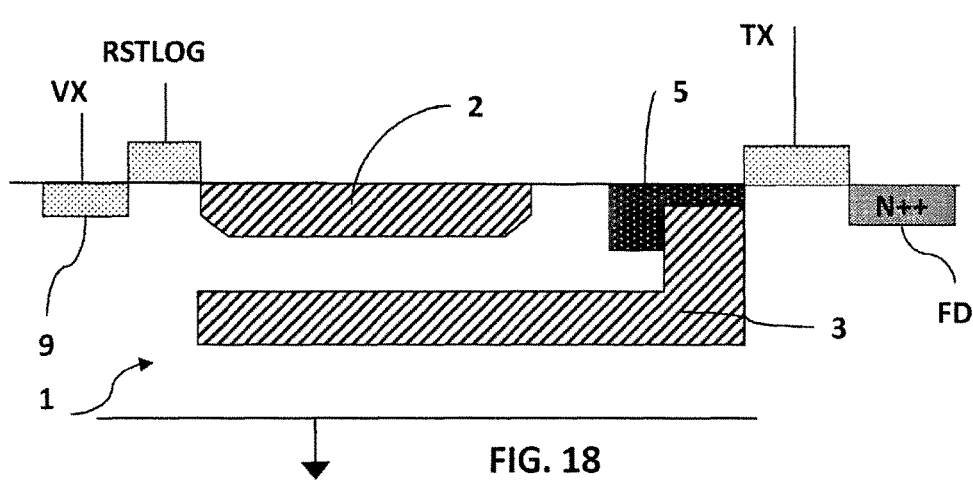

Nonetheless, the complexity of adjusting the threshold voltages of the transistors Ts1, Ts2 and Ts3 can be reduced by adding a variable bias voltage VX to the pixel as shown in FIGS. 17 and 18. These Figures respectively illustrate the wiring diagram and a cross-sectional view of the arrangement of the regions of the pixel structure according to one embodiment of the invention.

This embodiment is similar to the one previously described with reference to FIGS. 14 and 15 with the exception of the replacement of the short-circuiting structure of the photovoltaic conversion region 2. This is replaced by a node 9 to which a voltage VX is applied. This node 9 can be connected to the photovoltaic conversion region 2 by means of the reset transistor RSTLOG of said photovoltaic conversion region 2. This node 9 is formed by a heavily doped region of the second type, here N-type, biased with the variable voltage Vx, forming the reset region. The connection of this node 9 to the photovoltaic conversion region 2 allows the propagation of said variable voltage Vx as far as the floating diffusion node FD associated with the charge accumulation region 3.

Figure 19:
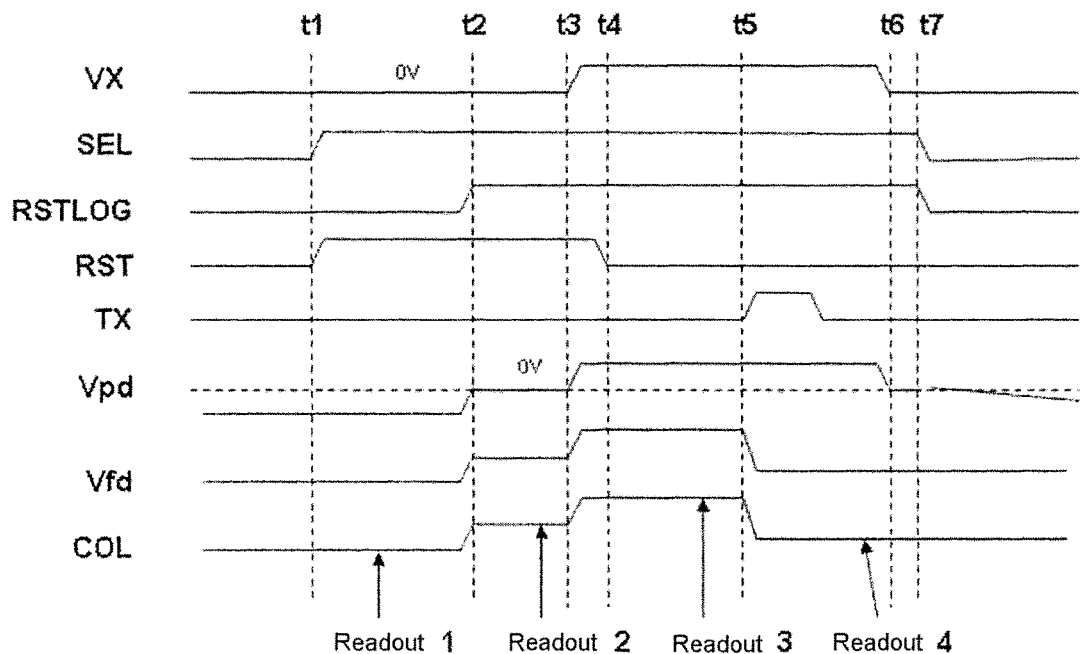
FIG. 19 is a chronogram illustrating the functioning of the structure in FIGS. 17 and 18.

The functioning of this structure is very close to that of the structure in FIGS. 14 and 15, and its operating chronogram illustrated in FIG. 19 is therefore logically very similar to the one FIG. 16. Therefore only the differences shall be mentioned herein.

In this configuration, the variable voltage VX changes to a value above 0 V after t3 and drops to 0 V after a time t6 occurring before deactivation of the signals SEL and RSTLOG at time t7. That is to say that the variable voltage VX remains at ground value during readout of the first photodiode, in photovoltaic mode, and moves to a higher value during the readout of the second photodiode in integration mode. The variable voltage VX therefore allows the precharging of the floating diffusion node FD to a voltage facilitating readout of the second photodiode. The adding of this variable voltage VX therefore provides greater flexibility in the choice of threshold voltages for the transistors Ts1, Ts2 and Ts3.

Figure 20:
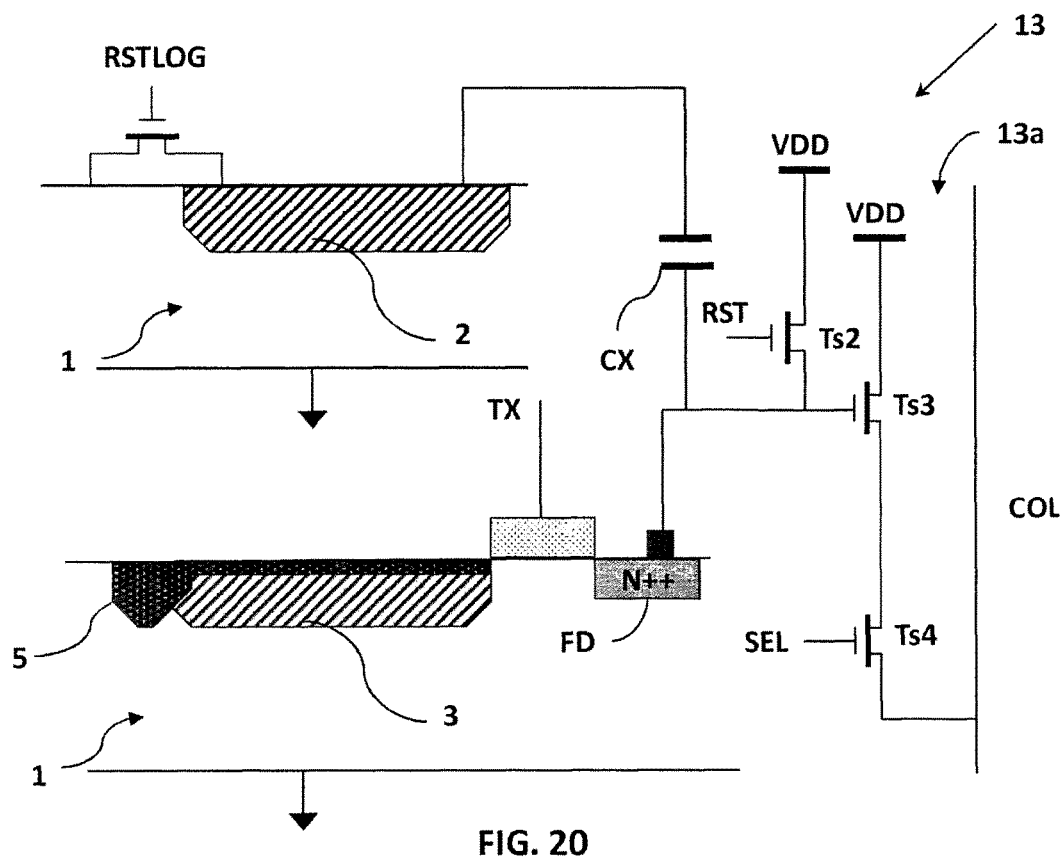
FIG. 20 is a wiring diagram of a pixel structure according to one possible embodiment of the invention wherein the common readout circuit comprises a capacitor.

FIG. 20 gives another variant allowing avoidance of this problem of choice of threshold voltages for the transistors Ts1, Ts2 and Ts3. In this variant, the structure remains similar to those previously described, except that the photovoltaic conversion region 2 is connected to the floating diffusion node via a capacitor CX instead of a voltage offset circuit. Another terminal of said capacitor CX is connected to the floating diffusion node FD. The capacitor CX can be in the form either of a structure separate from the first photodiode in photovoltaic mode, or in the form of a gate above this first photodiode.

Figure 21:
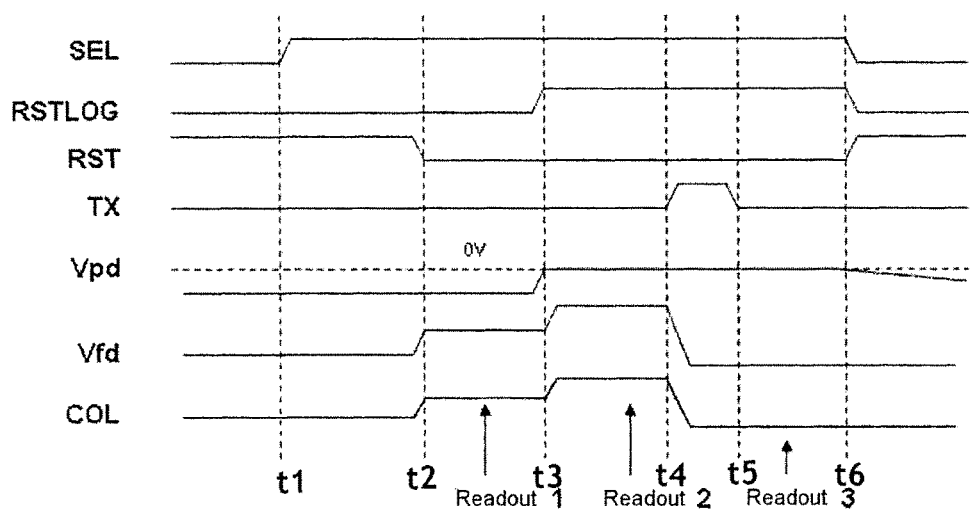
FIG. 21 is a chronogram illustrating the functioning of the structure in FIG. 20.

FIG. 21 illustrates the operating chronogram of the embodiment in FIG. 20. During exposure of the pixel, the signal RST is held at high level i.e. level "1". After the pixel has been selected via activation of the SEL signal at time t1, the signal RST is deactivated at time t2. A first readout (Readout 1) on the bus COL then reads the reset voltage on the floating diffusion node FD.

Next, the first photodiode in photovoltaic mode, also called solar-cell mode, is short-circuited by application of the signal RSTLOG at time t3. The variation in voltage on this first photodiode, corresponding to a logarithmic signal as a function of light, is transmitted to the floating diffusion node FD via the capacitor CX. A second readout (Readout 2) is then performed on the bus COL.

The difference between these readouts (Readout 1−Readout 2) gives the logarithmic response of the pixel. Knowing that this variation is always positive-wise, it is therefore not necessary to re-perform reset of the floating diffusion node FD.

The signal TX is activated at time t4. The photoelectric charge transmitted from the second photodiode causes a drop in the voltage on the floating diffusion node FD. At time t5, the transfer transistor TX is deactivated and a third readout is performed (Readout 3) on the bus COL. The difference between Readout 2 and Readout 3 gives the linear response of the pixel. Finally at t6, the signals RSTLOG and SEL are returned to low level, the signal RST to high level and exposure is recommenced.

Figure 22:
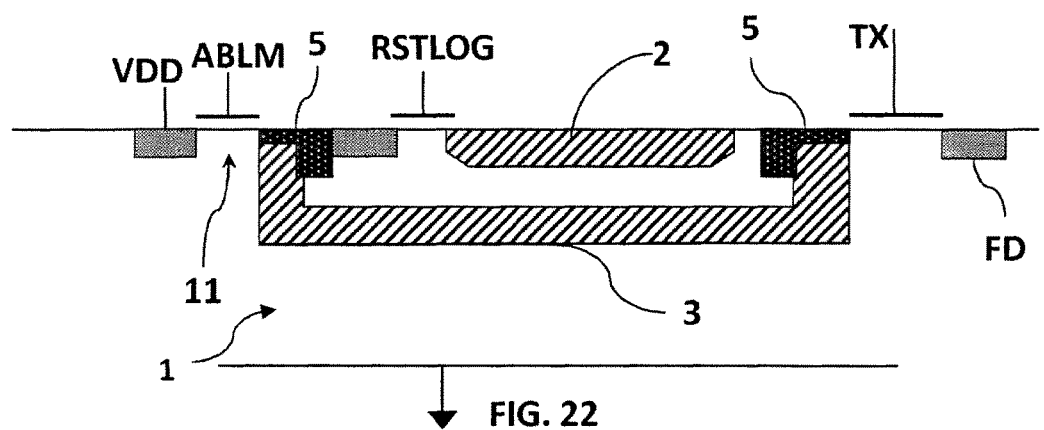
FIGS. 22 and 23 are cross-sectional views of possible embodiments of the invention wherein the anti-blooming function is used in a four-transistor structure.
Figure 23:
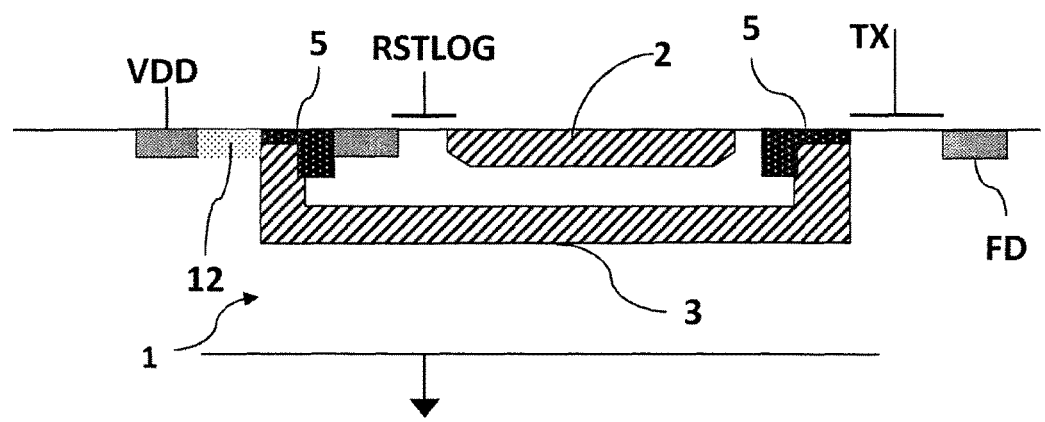

For all the embodiments with a second charge transfer photodiode, it is advantageous to make provision for an anti-blooming structure, different from the one in a four-transistor pixel. FIGS. 22 and 23 show two anti-blooming structures compatible with a second photodiode having a heavily doped region 5 of the same type as the substrate insulating the accumulation region 3 of said second photodiode from the surface of the substrate.

FIGS. 22 and 23 are cross-sections illustrating the stacked configuration of the different regions of the structure. The photovoltaic conversion region 2 is surrounded by a charge accumulation region 3, both laterally and in the depth of the substrate. Such configuration can also be envisaged for the other embodiments to maximise collection of the charge carriers.

In FIG. 22, an anti-blooming transistor 11 is arranged between a node at a voltage VDD and the accumulation region 3. Modulation of the voltage ABLM applied to its gate prevents the diffusion of the charge carriers outside the charge accumulation region 3 of the second photodiode. As a variant, in FIG. 23, it is an N-doped region 12 which replaces the anti-blooming transistor 11, and this doping creates a priority pathway for the charge carriers spilling over from the charge accumulation region 3.

Figure 5:
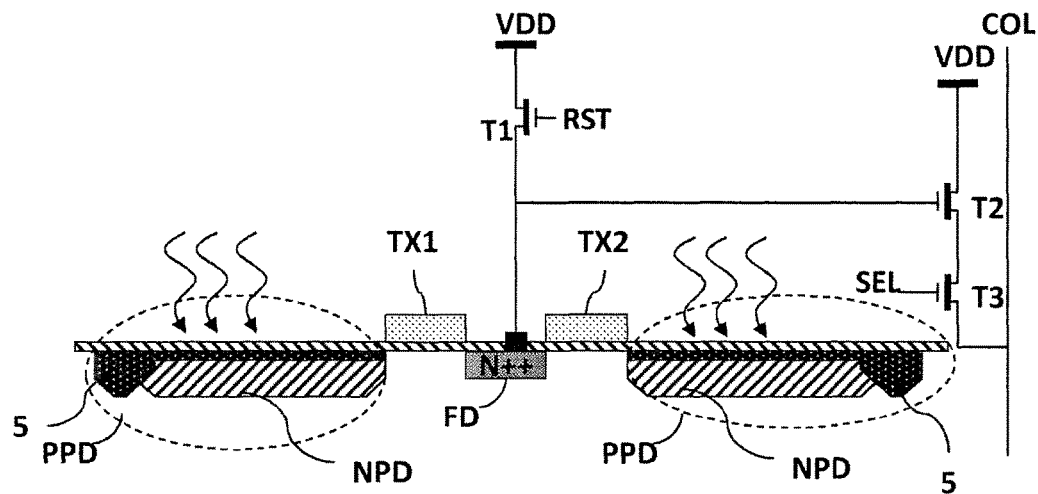
FIG. 5, already commented upon, is a schematic illustrating the sharing of a readout circuit by two pixels similar to the one in FIG. 3.
Figure 6:
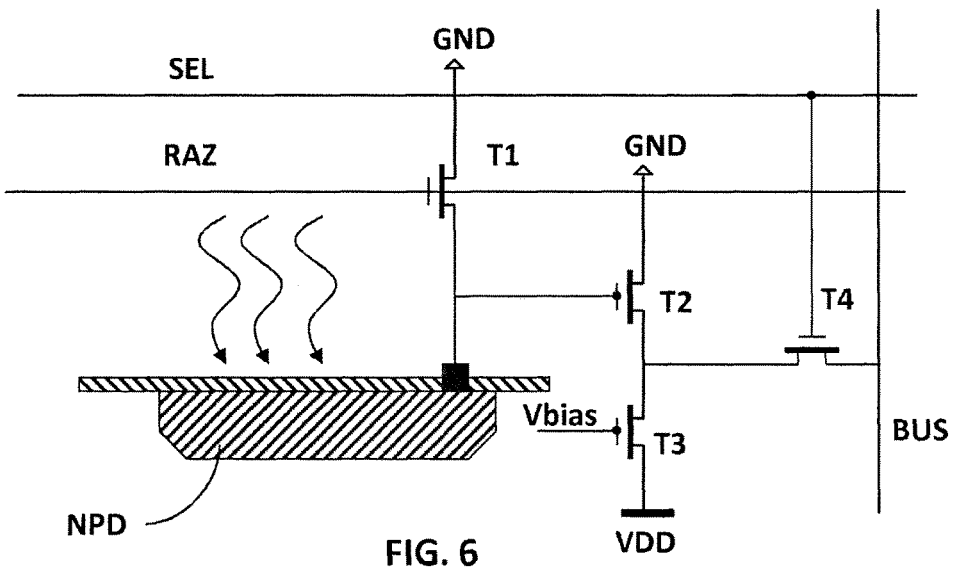
FIG. 6, already commented upon, is a schematic illustrating the structure of a four-transistor active pixel of the state of the art, operating in photovoltaic mode.

The different embodiments that have been presented can be combined at will in relation to feasibility, and elements presented in the state of the art can also be incorporated in particular embodiments. For example, a structure of the invention may have the twofold structure in FIG. 5. Similarly, the variant illustrated in FIG. 7 may come to be applied in the other embodiments.

In addition, in the illustrated examples the substrate is of P-type and the photovoltaic conversion region 2 as well as the charge accumulation region 3 and floating diffusion node FD are of N-type. However, other configurations can be used although this configuration is preferred.

The invention also concerns a sensor comprising:
a plurality of pixel structures according to the invention, preferably arranged in an array; and
at least one output circuit combining readout of the voltage of the first photodiode and readout of charge measurement at the second photodiode.

The combination of these readouts may be an addition for example, or more complex operations or simply the switching from one over to the other in relation to exposure conditions.

The invention claimed is:

1. An active pixel structure of CMOS type, comprising:
a semiconductor substrate of a first type,
at least one first photodiode configured to operate in photovoltaic mode during exposure of said first photodiode to radiation, comprising a photovoltaic conversion region defined by a doped region of a second type forming a PN junction with the substrate, said first photodiode being configured to re-emit photoelectric charge carriers captured by the PN junction during exposure of said first photodiode to radiation;
at least one second photodiode configured to operate in integration mode and to be reverse biased during exposure of said first photodiode to radiation, said second photodiode comprising a charge accumulation region defined by a doped region of the second type forming a PN junction with the substrate, said charge accumulation region being configured to be exposed to the charge carriers originating from the photovoltaic conversion region so as to accumulate said charge carriers; and
at least one readout circuit to read the voltage of the first photodiode and to read charge measurement at the second photodiode.

2. The structure according to claim 1, wherein the photovoltaic conversion region and the charge accumulation region are separated by a portion of substrate through which the charge carriers re-emitted by the first photodiode pass for collection and accumulation in the accumulation region, so that the depletion region of the PN junction of the first photodiode and the depletion region of the PN junction of the second photodiode are separate and do not touch one another.

3. The structure according to claim 1, wherein the substrate has spatially modulated doping defining a containment region for the charge carriers, said containment region grouping together the first and second photodiode.

4. The structure according to claim 2, wherein the distance between the photovoltaic conversion region and the charge accumulation region is between 0.1 μm and 100 μm.

5. The structure according claim 1, wherein the first photodiode(s) and the second photodiode(s) are intercalated in the substrate so that a photovoltaic conversion region lies adjacent to at least one charge accumulation region.

6. The structure according to claim 1, wherein the photovoltaic conversion region and the charge accumulation region are at least partly overlaid.

7. The structure according to claim 6, wherein the charge accumulation region has a spatial extension covering at least the extent of said photovoltaic conversion region.

8. The structure according to claim 1, wherein the second photodiode comprises a passivation layer having doping of the same type as the substrate and separating the charge accumulation region from a surface of the substrate.

9. The structure according to claim 1, wherein a reset transistor is adapted to connect a reset region arranged in the substrate to the photovoltaic conversion region.

10. The structure according to claim 9, wherein the reset region is formed by a substrate-contact formed by a heavily doped region of the first type in the substrate.

11. The structure according to claim 9, wherein the reset region is formed by a heavily doped region biased with a variable voltage Vx, to propagate said variable voltage as far as the floating diffusion node associated with the charge accumulation region.

12. The structure according to claim 1, wherein the at least one readout circuit of the first photodiode and the second photodiode is a readout circuit common to the first photodiode and second photodiode, at the pixel, connected to a common bus to read the voltage of the first photodiode and to read charge measurement at the second photodiode.

13. The structure according to claim 12, comprising a floating diffusion node associated with the charge accumulation region, wherein the common readout circuit comprises:
a charge transfer structure adapted to read the voltage of a floating diffusion node associated with the second photodiode;
a voltage offset circuit connecting the first photodiode to the floating diffusion node via a reset transistor of the charge transfer structure.

14. The structure according to claim 13, wherein the voltage offset circuit comprises a negative threshold voltage transistor the gate of which is connected to the photovoltaic conversion region.

15. The structure according to claim 12, comprising a floating diffusion node associated with the charge accumulation region, wherein the common readout circuit comprises a charge transfer structure adapted to read the voltage of a floating diffusion node associated with the second photodiode,
and wherein the photovoltaic conversion region is connected to the floating diffusion node via a capacitor.

16. A sensor comprising:
a plurality of pixel structures according to claim 1;
at least one output circuit combining the readout of the voltage of the first photodiode with the readout of charge measurement at the second photodiode.

17. An operating process of an active pixel of CMOS type having a structure according to claim 1 wherein:
the first photodiode operates in photovoltaic mode and re-emits photoelectric charge carriers captured by the PN junction during exposure of said first photodiode to radiation;
the second photodiode is reverse biased and operates in integration mode, said charge accumulation region being exposed to the charge carriers originating from the photovoltaic conversion region so as to accumulate said charge carriers;
the voltage of the first photodiode and charge measurement at the second photodiode are read by at least one readout circuit.

* * * * *